Figure 1:
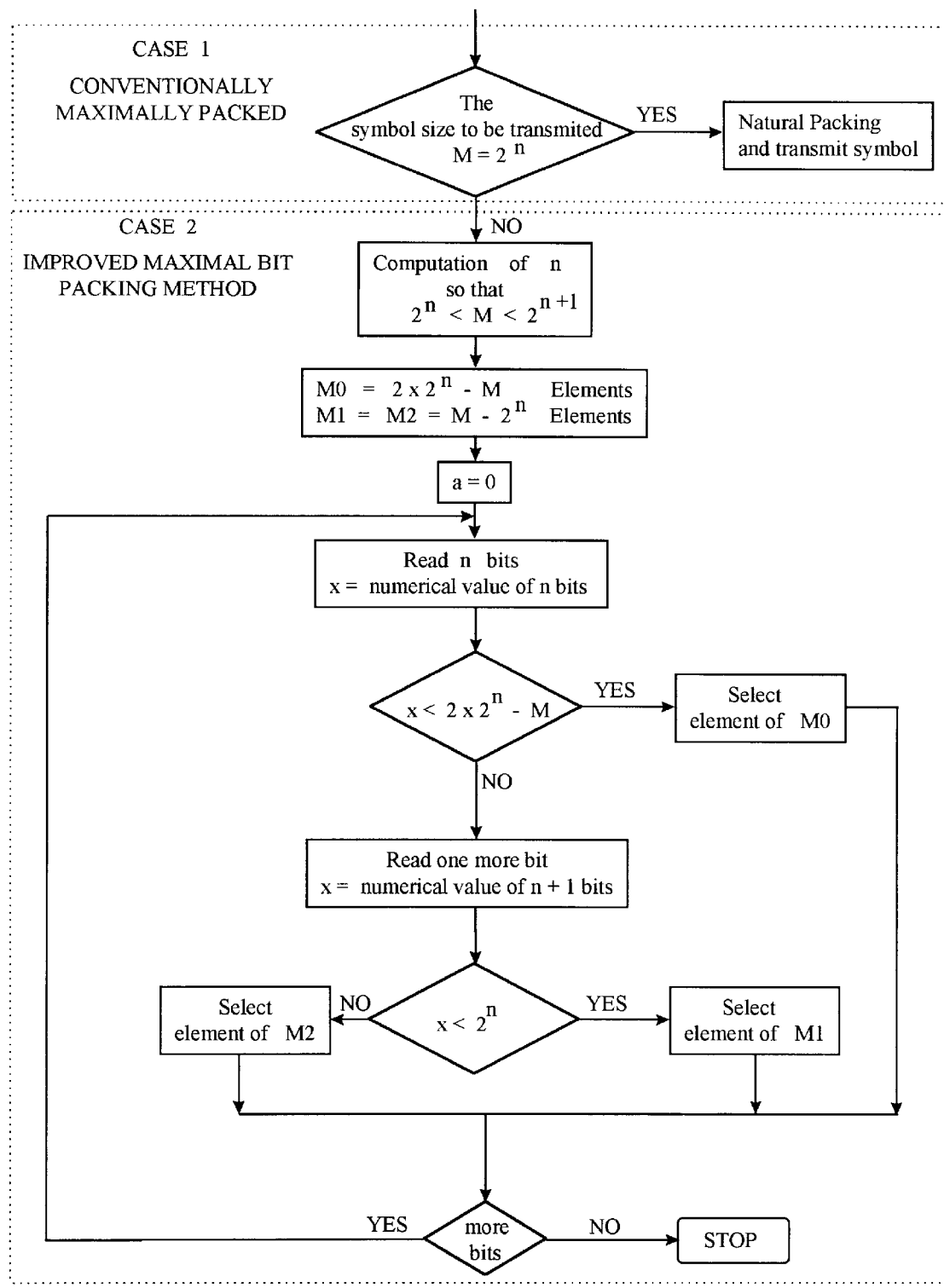

United States Patent

Hirzel et al.

[11] Patent Number: 6,067,034
[45] Date of Patent: May 23, 2000

[54] MAXIMAL BIT PACKING METHOD

[75] Inventors: Frederic J. Hirzel, Sunnyvale, Calif.; Victor Demjanenko, Pendleton; William M. Balisteri, Buffalo, both of N.Y.

[73] Assignee: Vocal Technologies Ltd., Buffalo, N.Y.

[21] Appl. No.: 09/056,330

[22] Filed: Apr. 7, 1998

Related U.S. Application Data

[60] Provisional application No. 60/043,074, Apr. 7, 1997.

[51] Int. Cl.$^7$ .................................................. H03M 7/00
[52] U.S. Cl. .............................................. 341/60; 341/50
[58] Field of Search .............................. 341/50, 51, 60, 341/52, 63, 53, 107, 59

[56] References Cited

U.S. PATENT DOCUMENTS

| | | | |
|---|---|---|---|
| 3,711,692 | 1/1973 | Batcher | 235/175 |
| 5,838,738 | 11/1998 | Zook | 375/340 |
| 5,841,379 | 11/1998 | Seshan et al. | 341/63 |

*Primary Examiner*—Michael Tokar
*Assistant Examiner*—Peguy JeanPierre
*Attorney, Agent, or Firm*—Simpson, Simpson & Snyder, L.L.P.

[57] ABSTRACT

A method of mapping a substring of a bit stream to a symbol selected from a set of symbols, comprising: determining if the numeric value of an n bit substring of the bit stream is below a threshold; selecting the symbol from a first subset of symbols if the numeric value is below the threshold; selecting the symbol from a second subset if the numeric value is equal to or greater than the threshold and the next bit of the bit stream is a 0; and, selecting the symbol from a third subset if the numeric value is equal to or greater than the threshold and the next bit of the bit stream is a 1.

1 Claim, 1 Drawing Sheet

MAXIMAL BIT PACKING METHOD

This nonprovisional patent application claims the benefit under 35 U.S.C. Section 119(e) of U.S. Provisional Patent Application No. 60/043,074, filed on Apr. 7, 1997.

FILED OF THE INVENTION

The PCM downstream channel will have symbol sets of sizes other than that of a power of 2. The symbol selection process should be maximized such that all symbols are chosen in such a way as to optimize the packing of bits to each symbol.

BACKGROUND OF THE INVENTION

Previous contributions attempted to maximize packing by creating a product of the sizes of the symbol sets to transmit over a number of symbols. This product is repeatedly factored to maximally pack transmit bits.

This product suffers two shortcomings: a large number of symbols must be used to create maximal packing; and any symbol error in the receiver affects several bits.

OBJECTS OF THE INVENTION

This contribution describes a method that is symbol based. It does not require repeated factoring and it does not create multiple bit sequence errors in the receiver.

BRIEF DESCRIPTION OF THE INVENTION

Assume a set of PCM symbols of size M. Two cases exist for M, namely.

| | | |
|---|---|---|
| Case 1. | $M = 2^n$; | n integer |
| Case 2. | $2^n < M < 2*2^n$; | n integer |

Case 1 represents a symbol set size which is a power of 2 and is obviously maximally packed.

Case 2 represents a symbol set size between powers of 2. This contribution will be concerned with Case 2.

The proposed method partitions the transmit symbol set into three subsets. The first subset encoded n input bits; the second and third subsets encode n+1 input bits. The size of the three symbols subsets are defined as:

| M0 | first symbol set size | $2*2^n - M$ |
|---|---|---|
| M1 | second symbol set size | $M - 2^n$ |
| M2 | third symbol set size | $M - 2^n$ |

The sum of the three symbol subset sizes is obviously:

$$M0 + M1 + M2 = (2*2^n - M) + M - 2^n + M - 2^n = M$$

Each subset is defined a value created directly from bits in the input transmit bit stream. The value is created with the least significant bit representing the first sequential bits.

The symbol sets are assigned values in the following ranges:

| M0 | first symbol values | $0 \le x < 2*2^n - M$ |
|---|---|---|
| M1 | second symbol values | $2*2^n - M \le x < 2^n$ |
| M2 | third symbol values | $2^n + 2*2^n - M \le x < 2*2^n$ |

The number of bits encoded in each symbol is as follows:

| M0 | number bits encoded in first symbol set | n |
|---|---|---|
| M1 | number bits encoded in second symbol set | n + 1 |
| M2 | number bits encoded in third symbol set | n + 1 |

The encoding process is to read n input bits. If the value represented in these n bits is of the first symbol subset M0, then these bits select one of the symbols in subset M0 and that symbol is sent. Otherwise, an additional input bit is read and its representative value is used to select symbols from either symbol subset M1 or symbol subset M2. The decoding process is straight forward. A symbol is received and its representative value, representing n or n+1 bits, is directly placed in the receive data stream.

PERFORMANCE OF PROPOSED METHOD

The performance of the proposed method is very easy to calculate. It is based upon the number of bits encoded within the three subsets multiplied by the expectation of each subset occurring in the input data stream. Assuming all input bits are equally probable:

$$\begin{aligned}
\text{bit rate} &= \text{number of bits of M0} * \text{probability of M0} \\
&+ \text{number of bits of M1} * \text{probability of M1} \\
&+ \text{number of bits of M2} * \text{probability of M2} \\
&= n * \text{probability of M0} \\
&+ (n + 1) * \text{probability of M1} \\
&+ (n + 1) * \text{probability of M2} \\
&= n * M0/2^n \\
&+ (n + 1) * (1 - M0/2^n) \\
&= n + 1 - M0/2^n \\
\text{substituting the size of M0};\ M0 &= 2*2^n - M \\
\text{bit rate} &= n + 1 - (2*2^n - M)/2^n \\
&= n - 1 + M/2^n
\end{aligned}$$

As a comparison to the previously contribution for product packing, Table 1. provides performance calculations of minimal bit packing (floor(log2(M)), theoretical maximal bit packing (log2(M)), product packing using 4D and 8D symbols, and the proposed packing bit rates.

COMMENTS OF PROPOSED METHOD

This packing stream will select those symbols of symbol subset M0 at a different rate than those of symbol subset M1 or symbol subset M2. If a white symbol spectrum is desired, the symbols within symbol sets M0 should be distributed in value such that the spectrum of selecting M0 is white. Similarly, the values within the symbol subset M1 and symbol subset M2 should produce white spectrums.

It is appreciated the actual bit values assigned to symbols within the subsets M0, M1, M2 are arbitrary and do not be need to be explicitly generated by the algorithm described here. Rather, it is the assignment of n and n+1 bits per subset, each subset of a particular size, which creates the maximal packing of the input data.

SYNOPSIS OF PROPOSED METHOD

The proposed packing method can be described as follows:

For transmit symbol set of size M

A. Create three subsets of the transmit symbol set M0, M1, M2 such that:

| | | |
|---|---|---|
| M0 | $2*2^n - M$ | elements |
| M1 | $M - 2^n$ | elements |
| M2 | $M - 2^n$ | elements |
| M0 | will encode | n input bits |
| M1 | will encode | n + 1 input bits |
| M2 | will encode | n + 1 input bits |

B. Input n input bits. If the value represented by these n bits is within the range $0<=x<2*2^n-M$, select a symbol from symbol subset M0; otherwise C. Input an additional input bit. If this n+1 input bit value represented is within the range $2*2^n-M<=x<2^n$, select a symbol from symbol set M1; otherwise D. The symbol is within the range $2^n+2*2^n-M<=x<2*2^n$ and selects a symbol from the symbol set M2.

E. The effective bit rate can determined by:

$$\text{bit rate} = n - 1 + M/2^n$$

EXAMPLE OF PROPOSED METHOD

Assume the transmit symbol size is 95. The minimal bit packing n can be calculated to be 6. Creating the symbol subsets M0, M1, M2;

| | | |
|---|---|---|
| M0 contains | 33 | elements |
| M1 contains | 31 | elements |
| M2 contains | 31 | elements |
| M0 would encode input bit values $0 <= x < 33$ | | |
| M1 would encode input bit values $33 <= x < 64$ | | |
| M2 would encode input bit values $97 <= x < 128$ | | |
| bit rate | = 6.484375 | |
| theoretical maximum = log2 (95) | = 6.56985560833 | |

CONCLUSIONS

This contribution describes a novel method for near maximal packing input bits into constellations which are not a power of 2. This method offers advantages to the previously proposed product packing method, because of the avoidance of factoring large integer numbers and single symbol sensitivity to symbol errors in the recovered receive stream. The incorporation of this method of near maximal packing will allow greater throughput while preserving the need for transmitting arbitrary symbol sets.

TABLE 1

Comparison of Bit Rates for Different Symbol Set Sizes and Different Packing Methods

| M | minimal | maximal | product-4D | product-8D | proposed |
|---|---|---|---|---|---|
| 64 | 6.00 | 6.00 | 6.00 | 6.00 | 6.00 |
| 65 | 6.00 | 6.02 | 6.00 | 6.00 | 6.02 |
| 66 | 6.00 | 6.04 | 6.00 | 6.00 | 6.03 |
| 67 | 6.00 | 6.07 | 6.00 | 6.00 | 6.05 |
| 68 | 6.00 | 6.09 | 6.00 | 6.00 | 6.06 |
| 69 | 6.00 | 6.11 | 6.00 | 6.00 | 6.08 |
| 70 | 6.00 | 6.13 | 6.00 | 6.12 | 6.09 |
| 71 | 6.00 | 6.15 | 6.00 | 6.12 | 6.11 |
| 72 | 6.00 | 6.17 | 6.00 | 6.12 | 6.12 |
| 73 | 6.00 | 6.19 | 6.00 | 6.12 | 6.14 |
| 74 | 6.00 | 6.21 | 6.00 | 6.12 | 6.16 |
| 75 | 6.00 | 6.23 | 6.00 | 6.12 | 6.17 |
| 76 | 6.00 | 6.25 | 6.00 | 6.12 | 6.19 |
| 77 | 6.00 | 6.27 | 6.25 | 6.25 | 6.20 |
| 78 | 6.00 | 6.29 | 6.25 | 6.25 | 6.22 |
| 79 | 6.00 | 6.30 | 6.25 | 6.25 | 6.23 |
| 80 | 6.00 | 6.32 | 6.25 | 6.25 | 6.25 |
| 81 | 6.00 | 6.34 | 6.25 | 6.25 | 6.27 |
| 82 | 6.00 | 6.36 | 6.25 | 6.25 | 6.28 |
| 83 | 6.00 | 6.38 | 6.25 | 6.38 | 6.30 |
| 84 | 6.00 | 6.39 | 6.25 | 6.38 | 6.31 |
| 85 | 6.00 | 6.41 | 6.25 | 6.38 | 6.33 |
| 86 | 6.00 | 6.43 | 6.25 | 6.38 | 6.34 |
| 87 | 6.00 | 6.44 | 6.25 | 6.38 | 6.36 |
| 88 | 6.00 | 6.46 | 6.25 | 6.38 | 6.38 |
| 89 | 6.00 | 6.48 | 6.25 | 6.38 | 6.39 |
| 90 | 6.00 | 6.49 | 6.25 | 6.38 | 6.41 |
| 91 | 6.00 | 6.51 | 6.50 | 6.50 | 6.42 |
| 92 | 6.00 | 6.52 | 6.50 | 6.50 | 6.44 |
| 93 | 6.00 | 6.54 | 6.50 | 6.50 | 6.45 |
| 94 | 6.00 | 6.55 | 6.50 | 6.50 | 6.47 |
| 95 | 6.00 | 6.57 | 6.50 | 6.50 | 6.48 |
| 96 | 6.00 | 6.58 | 6.50 | 6.50 | 6.50 |
| 97 | 6.00 | 6.60 | 6.50 | 6.50 | 6.52 |
| 98 | 6.00 | 6.61 | 6.50 | 6.50 | 6.53 |
| 99 | 6.00 | 6.63 | 6.50 | 6.62 | 6.55 |
| 100 | 6.00 | 6.64 | 6.50 | 6.62 | 6.56 |
| 101 | 6.00 | 6.66 | 6.50 | 6.62 | 6.58 |
| 102 | 6.00 | 6.67 | 6.50 | 6.62 | 6.59 |
| 103 | 6.00 | 6.69 | 6.50 | 6.62 | 6.61 |
| 104 | 6.00 | 6.70 | 6.50 | 6.62 | 6.62 |
| 105 | 6.00 | 6.71 | 6.50 | 6.62 | 6.64 |
| 106 | 6.00 | 6.73 | 6.50 | 6.62 | 6.66 |
| 107 | 6.00 | 6.74 | 6.50 | 6.62 | 6.67 |
| 108 | 6.00 | 6.75 | 6.75 | 6.75 | 6.69 |
| 109 | 6.00 | 6.77 | 6.75 | 6.75 | 6.70 |
| 110 | 6.00 | 6.78 | 6.75 | 6.75 | 6.72 |
| 111 | 6.00 | 6.79 | 6.75 | 6.75 | 6.73 |
| 112 | 6.00 | 6.81 | 6.75 | 6.75 | 6.75 |
| 113 | 6.00 | 6.82 | 6.75 | 6.75 | 6.77 |
| 114 | 6.00 | 6.83 | 6.75 | 6.75 | 6.78 |
| 115 | 6.00 | 6.85 | 6.75 | 6.75 | 6.80 |
| 116 | 6.00 | 6.86 | 6.75 | 6.75 | 6.81 |
| 117 | 6.00 | 6.87 | 6.75 | 6.75 | 6.83 |
| 118 | 6.00 | 6.88 | 6.75 | 6.88 | 6.84 |
| 119 | 6.00 | 6.89 | 6.75 | 6.88 | 6.86 |
| 120 | 6.00 | 6.91 | 6.75 | 6.88 | 6.88 |
| 121 | 6.00 | 6.92 | 6.75 | 6.88 | 6.89 |
| 122 | 6.00 | 6.93 | 6.75 | 6.88 | 6.91 |
| 123 | 6.00 | 6.94 | 6.75 | 6.88 | 6.92 |
| 124 | 6.00 | 6.95 | 6.75 | 6.88 | 6.94 |
| 125 | 6.00 | 6.97 | 6.75 | 6.88 | 6.95 |
| 126 | 6.00 | 6.98 | 6.75 | 6.88 | 6.97 |
| 127 | 6.00 | 6.99 | 6.75 | 6.88 | 6.98 |
| 128 | 7.00 | 7.00 | 7.00 | 7.00 | 7.00 |

What we claim is:

1. A method of mapping a substring of a bit stream to a symbol selected from a set of symbols, comprising:

determining if a numeric value of an n bit substring of said bit stream is below a threshold;

selecting said symbol from a first subset of symbols if said numeric value is below said threshold;

selecting said symbol from a second subset if said numeric value is equal to or greater than said threshold and the next bit of said bit stream is a 0; and, selecting said symbol from a third subset if said numeric value is equal to or greater than said threshold and the next bit of said bit stream is a 1.

* * * * *